United States Patent
Lee

(10) Patent No.: US 9,607,698 B2
(45) Date of Patent: Mar. 28, 2017

(54) SEMICONDUCTOR MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/980,083

(22) Filed: Dec. 28, 2015

(65) Prior Publication Data

US 2017/0025176 A1    Jan. 26, 2017

(30) Foreign Application Priority Data

Jul. 23, 2015  (KR) ......................... 10-2015-0104566

(51) Int. Cl.
| | | |
|---|---|---|
| G11C 16/10 | (2006.01) | |
| G11C 16/34 | (2006.01) | |
| G11C 11/56 | (2006.01) | |

(52) U.S. Cl.
CPC .......... G11C 16/10 (2013.01); G11C 11/5628 (2013.01); G11C 16/3459 (2013.01)

(58) Field of Classification Search
CPC .. G11C 16/10; G11C 11/5628; G11C 16/3459
See application file for complete search history.

(56) References Cited

U.S. PATENT DOCUMENTS

| | | | | |
|---|---|---|---|---|
| 6,278,632 B1* | 8/2001 | Chevallier | .......... | G11C 11/5621 365/185.03 |
| 2005/0024939 A1* | 2/2005 | Chen | ................... | G11C 11/5628 365/185.17 |
| 2008/0219050 A1* | 9/2008 | Shalvi | ................. | G11C 11/5628 365/185.03 |
| 2011/0085379 A1* | 4/2011 | Kim | ..................... | G11C 11/5628 365/185.03 |
| 2011/0255345 A1* | 10/2011 | Dong | .................. | G11C 11/5628 365/185.22 |

FOREIGN PATENT DOCUMENTS

| | | |
|---|---|---|
| KR | 1020110001916 | 1/2011 |
| KR | 1020120118764 | 10/2012 |
| KR | 1020130133419 | 12/2013 |

* cited by examiner

*Primary Examiner* — Pho M Luu
*Assistant Examiner* — Ajay Ojha
(74) *Attorney, Agent, or Firm* — IP & T Group LLP

(57) ABSTRACT

A semiconductor memory device may include a plurality of memory cells programmed to have one of first to $N^{th}$ program states differentiated according to threshold voltages of the memory cells, the method including determining whether there exists over program cells from among memory cells programmed to a $N-1^{th}$ program state, by using a first verify voltage of a $N^{th}$ program state from among the first to $N^{th}$ program states; when there exists over program cells, determining whether the number of the over program cells exceeds a reference value; and when the number of over program cells exceeds the reference value, outputting a program fail signal to a controller.

16 Claims, 8 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2015-0104566, filed on Jul. 23, 2015, the entire disclosure of which is herein incorporated by reference in its entirety.

BACKGROUND

Field of Invention

Various embodiments of the present invention relate to an electronic device, and more particularly, to a semiconductor memory device and an operating method thereof.

Description of Related Art

A semiconductor memory device is realized using a semiconductor such as silicon (Si), germanium (Ge), gallium arsenide (GaAs), indium phosphide (InP), and the like. Semiconductor memory devices may be largely classified into volatile memory devices and nonvolatile memory devices.

A volatile memory device is a memory device from which data stored therein is erased once power supply is cut off. Examples of volatile memory devices include the Static RAM (SRAM), the Dynamic RAM (DRAM), the Synchronous DRAM (SDRAM), and the like. A nonvolatile memory device is a memory device where data stored therein is retained even when power supply is cut off. Examples of nonvolatile memory devices include the read only memory (ROM), the mask ROM (MROM), the programmable ROM (PROM), the electrically programmable ROM (EPROM), the electrically erasable and programmable ROM (EEPROM), the flash memory, the phase-change RAM (PRAM), the magnetic RAM (MRAM), the resistive RAM (RRAM), the ferroelectric RAM (FRAM), and the like. Flash memory devices may be classified into NOR type flash memory devices and NAND type flash memory devices.

SUMMARY

Various embodiments of the present invention are directed to a semiconductor memory device having improved reliability and an operating method thereof.

In an embodiment, an operating method of a semiconductor memory device may include a plurality of memory cells programmed to have one of first to $N^{th}$ program states differentiated according to threshold voltages of the memory cells, the method including: determining whether there exists over program cells from among the memory cells programmed to a $N-1^{th}$ program state, by using a first verify voltage of a $N^{th}$ program state from among the first to $N^{th}$ program states; when there exists over program cells, determining whether the number of the over program cells exceeds a reference value; and when the number of over program cells exceeds the reference value, outputting a program fail signal to a controller.

In another embodiment, an operating method of a semiconductor memory device may include a plurality of memory cells programmed to have one of first to $N^{th}$ program states differentiated according to threshold voltages of the memory cells, the method including: determining whether there exists over program cells from among memory cells programmed to a $N-1^{th}$ program state, by using a first verify voltage of a $N^{th}$ program state from among the first to $N^{th}$ program states; determining a second verify voltage of the $N^{th}$ program state according to a result of the determining whether there exists over program cells; and performing a verify operation to the memory cells to be programmed to the $N^{th}$ program state using the determined second verify voltage.

In another embodiment, a semiconductor memory device may include a plurality of memory cells programmed to have one of a first to $N^{th}$ program states differentiated according to threshold voltages of the memory cells; and a peripheral circuit suitable for: determining whether there exists over program cells from among memory cells programmed to a $N-1^{th}$ program state using a first verify voltage of a $N^{th}$ program state from among the first to $N^{th}$ program state, when there exists over program cells, determining whether the number of the over program cells exceeds a reference value, and when the number of over program cells exceeds the reference value, outputting a program fail to a controller.

In another embodiment, a semiconductor memory device may include a plurality of memory cells programmed to have one of a first to $N^{th}$ program states differentiated according to threshold voltages of the memory cells; and a peripheral circuit suitable for: determining whether there exists over program cells from among memory cells programmed to a $N-1^{th}$ program state using a verify voltage of a $N^{th}$ program state from among the first to $N^{th}$ program states, and determining whether a program operation is a pass or a fail according to a result of the determination of whether there exists over program cells.

BRIEF DESCRIPTION OF THE DRAWINGS

The above and other features and advantages of the present disclosure will become more apparent to those of ordinary skill in the art by describing in detail embodiments with reference to the attached drawings in which.

DETAILED DESCRIPTION

Figure 1:
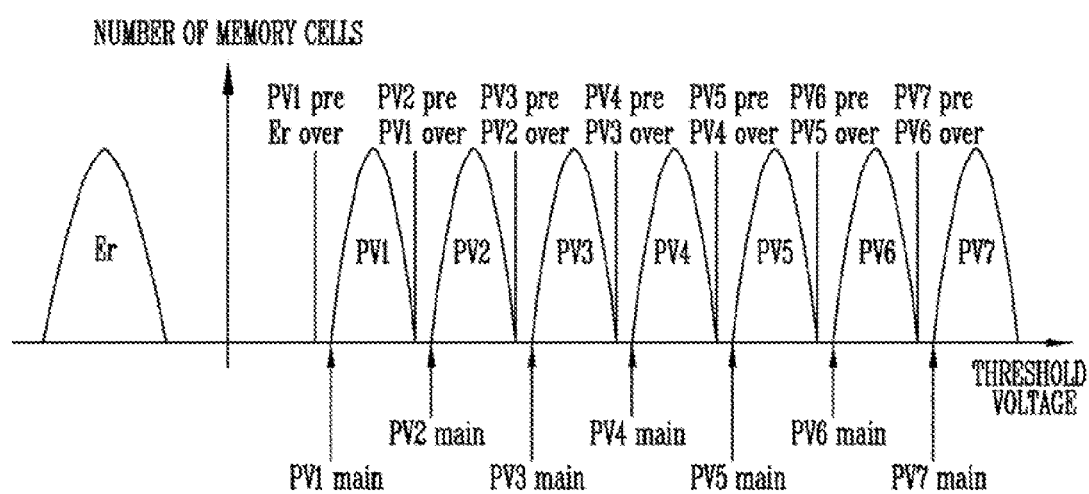
FIG. 1 is a diagram of a semiconductor memory device according to an embodiment of the present disclosure.

Hereinafter, embodiments will be described in greater detail with reference to the accompanying drawings. Embodiments are described herein with reference to cross-sectional illustrates that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present invention. Furthermore, 'and/or' may include any one of or a combination of the components mentioned.

Furthermore, 'connected/accessed' represents that one component is directly connected or accessed to another component or indirectly connected or accessed through another component.

In this specification, a singular form may include a plural form as long as it is not specifically mentioned in a sentence. Furthermore, 'include/comprise' or 'including/comprising' used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

FIG. 1 is a view for explaining a program verify voltage of a semiconductor memory device according to an embodiment of the present disclosure.

Prior to a program operation, selected memory cells each have a threshold voltage corresponding to an erase state Er. For example, the range of a threshold voltage corresponding to the erase state Er may be below a ground voltage. The selected memory cells of a semiconductor memory device may be programmed to have one of a plurality of program states PV1 to PVN according to the data to be programmed. Specifically, the selected memory cells may be programmed to have a threshold voltage of one of a first to $N^{th}$ program state PV1 to PVN.

During a program verify operation of the selected memory cells, a double verify operation may be used where two verify voltages are used for each program loop. With the selected memory cells programmed, threshold voltages of the memory cells are detected twice using a second verify voltage, which is a target verify voltage, and a first verify voltage, which is less than the target verify voltage, during the double verify operation. According to a result of that detection, the memory cells are classified into first memory cells of which threshold voltages are less than the first verify voltage, second memory cells of which threshold voltages are greater than the first verify voltage and less than the second verify voltage, and third memory cells of which threshold voltages are greater than the second verify voltage.

During the double verify operation, the program operation may be repeated for the first and second memory cells, of which threshold voltages are less than the second verify voltage, through an Incremental Step Pulse Programming (ISSP) method of re-programming the memory cells using a greater program voltage than the previous program voltage. Herein, when re-programming the first and second memory cells, the extent of increase of the second memory cells may be reduced by applying an 0V to bit lines connected to the first memory cells and by applying a voltage that is greater than the 0V and less than a source voltage Vcc to bit lines connected to the second memory cells, thereby preventing the threshold voltage of the second memory cells from increasing above the target verify voltage. Therefore, it is possible to program the selected memory cells such that their threshold voltages are distributed within a narrow range.

According to a conventional program verify operation, a verify operation is performed with only a low voltage of each program state, and thus there is a probability of program cells programmed to a high voltage or above the high voltage of the corresponding program state. Due to this, an error bit may occur during a read operation, making it necessary to set a read margin of an unnecessarily large width.

According to a double verify operation of the present disclosure, a first verify voltage is set to a high voltage of a program state lower than a corresponding program state. During a first verify operation using the first verify voltage for the corresponding program state, a verify operation for the memory cells of the lower program state is performed so as to identify the over program cells of the lower program state. More detailed explanation on a verify voltage may be explained hereinafter with reference to FIG. 3.

FIG. 1 is based on an assumption that before program operation, selected memory cells are at an erased state, and then a program is performed such that threshold voltages are distributed in an erased state and first to seventh program states PV1 to PV7 according to the program operation.

The memory cells of program states may be verified using a first verify voltage and second verify voltage. In various embodiments, the first verify voltage may be a pre-verify voltage, and the second verify voltage may be a main verify voltage.

The first verify voltage at a single program state may be used in a first verify operation for the program state, and a second verify voltage may be used in a second verify operation for the program state.

Herein, the first verify voltage may be a high voltage of a lower program state of the program state, and the second verify voltage may a low voltage of the program state.

Furthermore, the first verify voltage of the program state may be used in verifying an over program for the lower program state of the program state. That is, the first verify voltage may be used in the first verify operation for the program state and over program verify operation for the lower program state of the program state, and the second verify voltage may be used in the second verify operation for the program state.

The first verify voltage PV1 pre of the first program state PV1 may be set to be the same as an erase margin voltage Er over regarding cells of the erase state. The first verify voltage PV2 pre of the second program state PV2 may be set to the same voltage level as the over program verify voltage PV1 over of the first program state. The first verify voltage PV3 pre of the third program state PV3 may be set to the same voltage level as the over program verify voltage PV2 over of the second program state. The first verify voltage PV4 pre of the fourth program state PV4 may be set to the same voltage level as the over program verify voltage PV3 over of the third program state. The first verify voltage PV5 pre of the fifth program state PV5 may be set to the same voltage level as the over program verify voltage PV4 over of the fourth program state. The first verify voltage PV6 pre of the sixth program state PV6 may be set to the same voltage level as the over program verify voltage PV5 over of the fifth program state. The first verify voltage PV7 pre of the seventh program state PV7 may be set to the same voltage level as the over program verify voltage PV6 over of the sixth program state. In various embodiments, in a case of the seventh program state PV7, only an over program verify operation may be performed regarding the sixth program state PV6 without performing the first verify operation.

Figure 2:
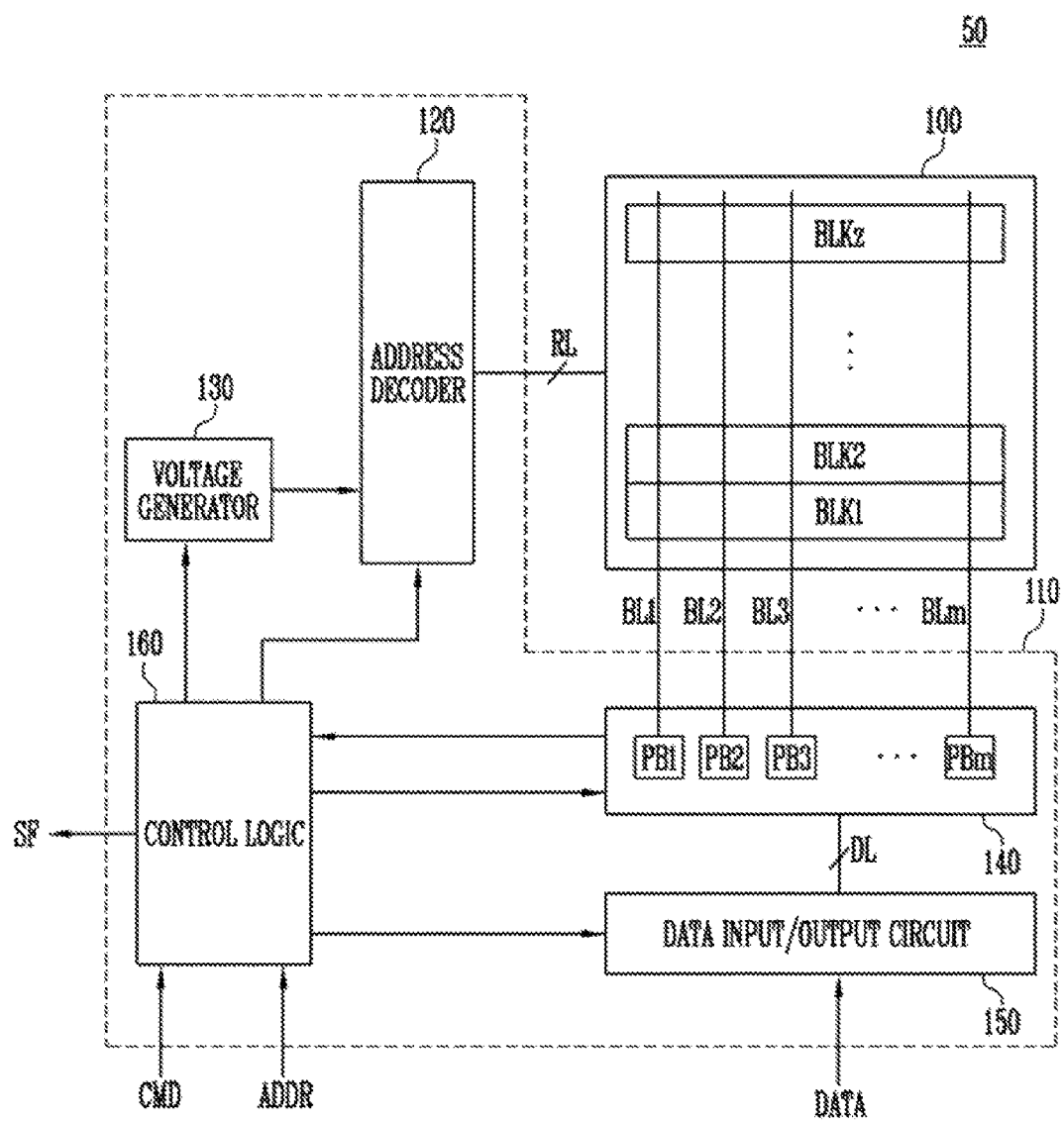
FIG. 2 is a block diagram illustrating a semiconductor memory device according to an embodiment of the present disclosure.
Figure 3:
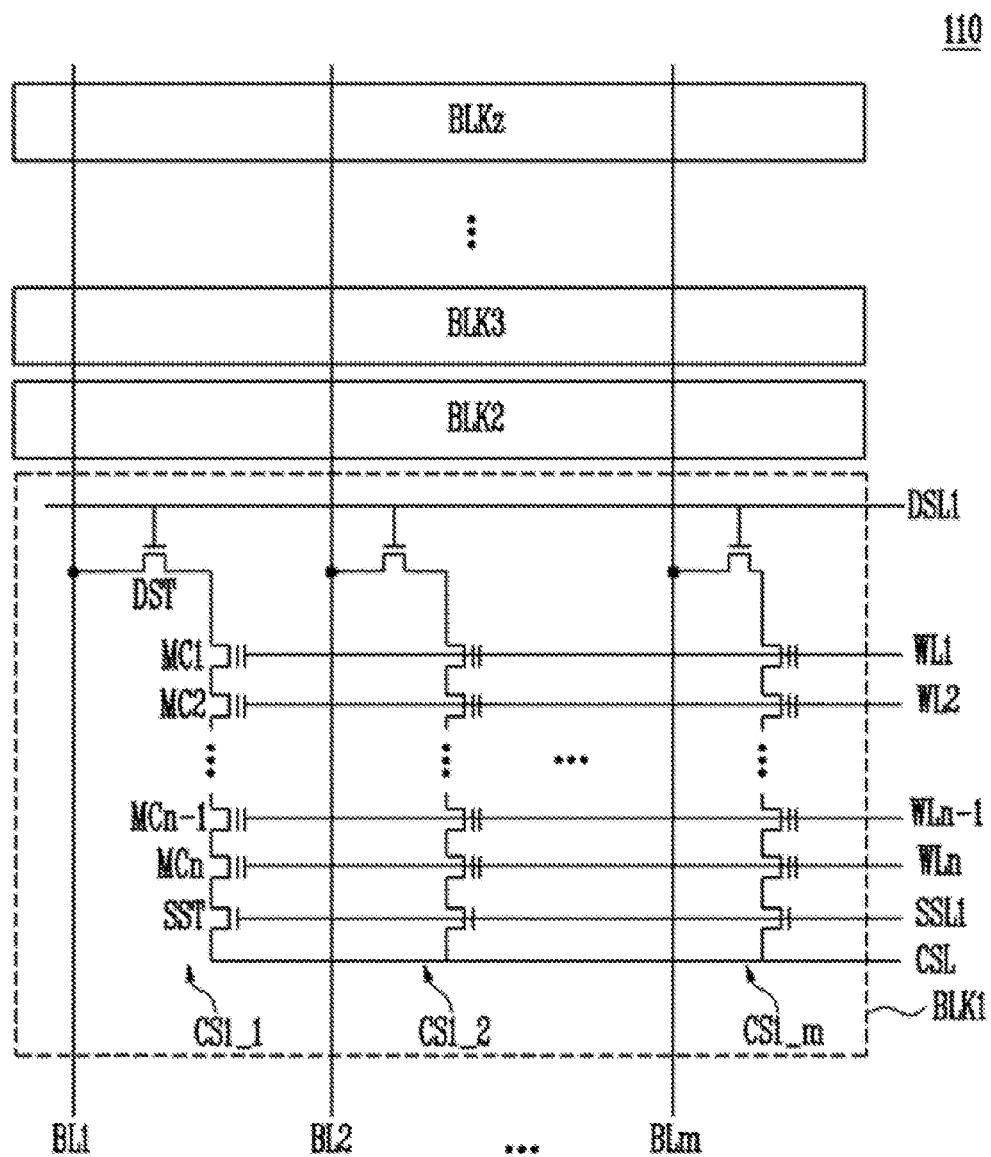
FIG. 3 is a block diagram of a memory cell array of FIG. 2.

FIG. 2 is a block diagram illustrating a semiconductor memory device 50 according to an embodiment of the present disclosure. FIG. 3 is a block diagram for explaining a memory cell array 110 of FIG. 2.

Referring to FIG. 2, the semiconductor memory device 50 includes a memory cell array 100 and a peripheral circuit 110.

The memory cell array 100 includes a plurality of memory blocks BLK1 to BLKz. The plurality of memory blocks BLK1 to BLKz are connected to an address decoder 120 through lines RL, and are connected to a reading and writing circuit 140 through bit lines BL1 to BLm. Each of the memory blocks BLK1 to BLKz includes a plurality of memory cells. In an embodiment, the plurality of memory cells are nonvolatile memory cells.

Referring to FIG. 3, the first to $z^{th}$ memory blocks BLK1 to BLKz are commonly connected to the first to $m^{th}$ bit lines BL1 to BLm. FIG. 3 illustrates elements included in the first memory block BLK1 of the plurality of memory blocks BLK1 to BLKz, and elements included in each of the remaining memory blocks BLK2 to BLKz are omitted. It should be understood that each of the remaining memory blocks BLK2 to BLKz is configured in the same manner as the first memory block BLK1.

The memory block BLK1 includes a plurality of cell strings CS1_1 to CS1_$m$. Each of the first to $m^{th}$ cell strings CS1_1 to CS1_$m$ is connected to the first to $m^{th}$ bit lines BL1 to BLm.

Each of the first to $m^{th}$ cell strings CS1_1 to CS1_$m$ includes a drain selection transistor DST, a plurality of serially connected memory cells MC1 to MCn, and a source selection transistor SST. The drain selection transistor DST is connected to a drain selection line DSL1. The first to $n^{th}$ memory cells MC1 to MCn are each connected to first to $n^{th}$ word lines WL1 to WLn. The source selection transistor SST is connected to the source selection line SSL1. A drain side of the drain selection transistor DST is connected to a corresponding bit line. Drain selection transistors of the first to $m^{th}$ cell strings CS1_1 to CS1_$m$ are each connected to the first to $m^{th}$ bit lines BL1 to BLm. A source side of the source selection transistor SST is connected to a common source line CSL. In an embodiment, the common source line CSL may be commonly connected to the first to $z^{th}$ memory blocks BLK1 to BLKz.

The drain selection line DSL1, first to $n^{th}$ word lines WL1 to WLn, and source selection line SSL1 are included in lines RL of FIG. 2. The drain selection line DSL1, first to $n^{th}$ word lines WL1 to WLn, and source selection line SSL1 are controlled by the address decoder 120. The common source line CSL is controlled by a control logic 160. The first to $m^{th}$ bit lines BL1 to BLm are controlled by a reading and writing circuit 140.

Referring to FIG. 2 again, the peripheral circuit 110 includes the address decoder 120, voltage generator 130, reading and writing circuit 140, data input/output circuit 150, and control logic 160.

The address decoder 120 is connected to the memory cell array 110 through lines RL. The address decoder 120 is configured to operate under the control of the control logic 160.

The address decoder 120 receives an address ADDR through the control logic 160. The program operation of the semiconductor memory device 50 is performed in word line units. During the program operation, the address ADDR may include a block address and line address.

The address decoder 120 is configured to decode a block address of the received address ADDR. The address decoder 120 selects one memory block of the memory blocks BLK1 to BLKz according to the decoded block address.

The address decoder 120 is configured to decode the line address of the received address ADDR. The address decoder 120 applies voltages provided from the voltage generator 130 to the lines RL according to the decoded line address, and selects one word line of the selected memory block. During the program operation, the address decoder 120 may apply a program pulse to the selected word line, and apply a pass pulse that is less than the program pulse to unselected word lines. During the program verify operation, the address decoder 120 may apply a verify voltage to the selected word line, and apply a verify pass voltage that is greater than the verify voltage to the unselected word lines.

In an embodiment, the address decoder 120 may include an address buffer, block decoder and line decoder.

The voltage generator 130 is configured to generate a plurality of voltages using an external power voltage. The voltage generator 130 operates under the control of the control logic 160.

In an embodiment, the voltage generator 130 may regulate the external power voltage and generate an internal power voltage. The internal power voltage generated in the voltage generator 130 is used as an operating voltage of the semiconductor memory device 50.

In an embodiment, the voltage generator 130 may generate a plurality of voltages using the external power voltage or internal power voltage. For example, the voltage generator 130 may include a plurality of pumping capacitors that receive the internal power voltage, and may selectively activate the plurality of pumping capacitors under the control of the control logic 160 and generate a plurality of voltages. The generated voltages are applied to the word lines by the address decoder 120. During the program operation, the voltage generator 130 may generate a program pulse of high voltage and a pass pulse that is less than the program pulse. During the program operation, the voltage generator 130 may generate a verify voltage and a verify pass voltage that is greater than the verify voltage.

The reading and writing circuit 140 includes a first to $m^{th}$ page buffers PB1 to PBm. Each of the first to $m^{th}$ page buffers PB1 to PBm is connected to the memory cell array 110 through the first to $m^{th}$ bit lines BL1 to BLm. The first to $m^{th}$ page buffers PB1 to PBm operate under the control of the control logic 160.

The first to $m^{th}$ page buffers PB1 to PBm perform data communication with the data input/output circuit 150. During the program operation, the first to $m^{th}$ page buffers PB1 to PBm receive data DATA to be stored through the data input/output circuit 150 and data lines DL. When a program pulse is applied to a selected word line, the first to $m^{th}$ page buffers PB1 to PBm may transmit the data DATA to be stored to the selected memory cells through the bit lines BL1 to BLm. The memory cell connected to the bit line where the program permission voltage (e.g., the ground voltage), is applied may have an increased threshold voltage. The threshold voltage of the memory cell connected to the bit line where the program inhibit voltage (e.g., for example, the source voltage) is applied may be maintained. During the program verify operation, the first to $m^{th}$ page buffers PB1 to PBm read page data through the bit lines BL1 to BLm from the selected memory cells.

In an embodiment, the reading and writing circuit 140 may include a thermal selection circuit.

The data input/output circuit 150 is connected to the first to $m^{th}$ page buffers PB1 to PBm through the data lines DL. The data input/output circuit 150 operates under the control of the control logic 160. During the program operation, the data input/output circuit 150 receives data DATA to be stored from an external controller (not illustrated).

The control logic 160 is connected to the address decoder 120, voltage generator 130, reading and writing circuit 140, and data input/output circuit 150. The control logic 160 receives a command CMD and the address ADDR from the external controller. The control logic 160 is configured to control the address decoder 120, voltage generator 130, reading and writing circuit 140 and data input/output circuit 150 in response to the command CMD. The control logic 160 transmits the address ADDR to the address decoder 120.

In an embodiment of the present disclosure, when receiving a program command CMD that instructs the program operation, the peripheral circuit 110 may perform at least one program operation regarding the selected memory cells. During the program operation, a program voltage may be applied to the selected word line. When the program voltage is applied, the peripheral circuit 110 may perform at least one verify operation, and may output a state fail signal 160 or a program completion signal (not illustrated) to the external controller according to a result of the verify operation.

Page data read from the selected memory cells during the verify operation may be temporarily stored in the first to $m^{th}$ page buffers PB1 to PBm. The first to $m^{th}$ page buffers PB1 to PBm may transmit the verification result to the control logic 160 under the control of the control logic 160.

In the present disclosure, a pre-verify and main verify operation of a corresponding program state are performed using the first verify voltage and second verify voltage each corresponding to the first to $N^{th}$ program states PV1 to PVN. At the same time or sequentially, the over program verify operation is performed regarding the lower program state of the corresponding program state using the first verify voltage.

The first to $m^{th}$ page buffers PB1 to PBm transmit the verification result to the control logic 160, and the control logic 160 may output the state fail signal 160 or the program completion signal (not illustrated) to the external controller according to the verification result.

Figure 4:
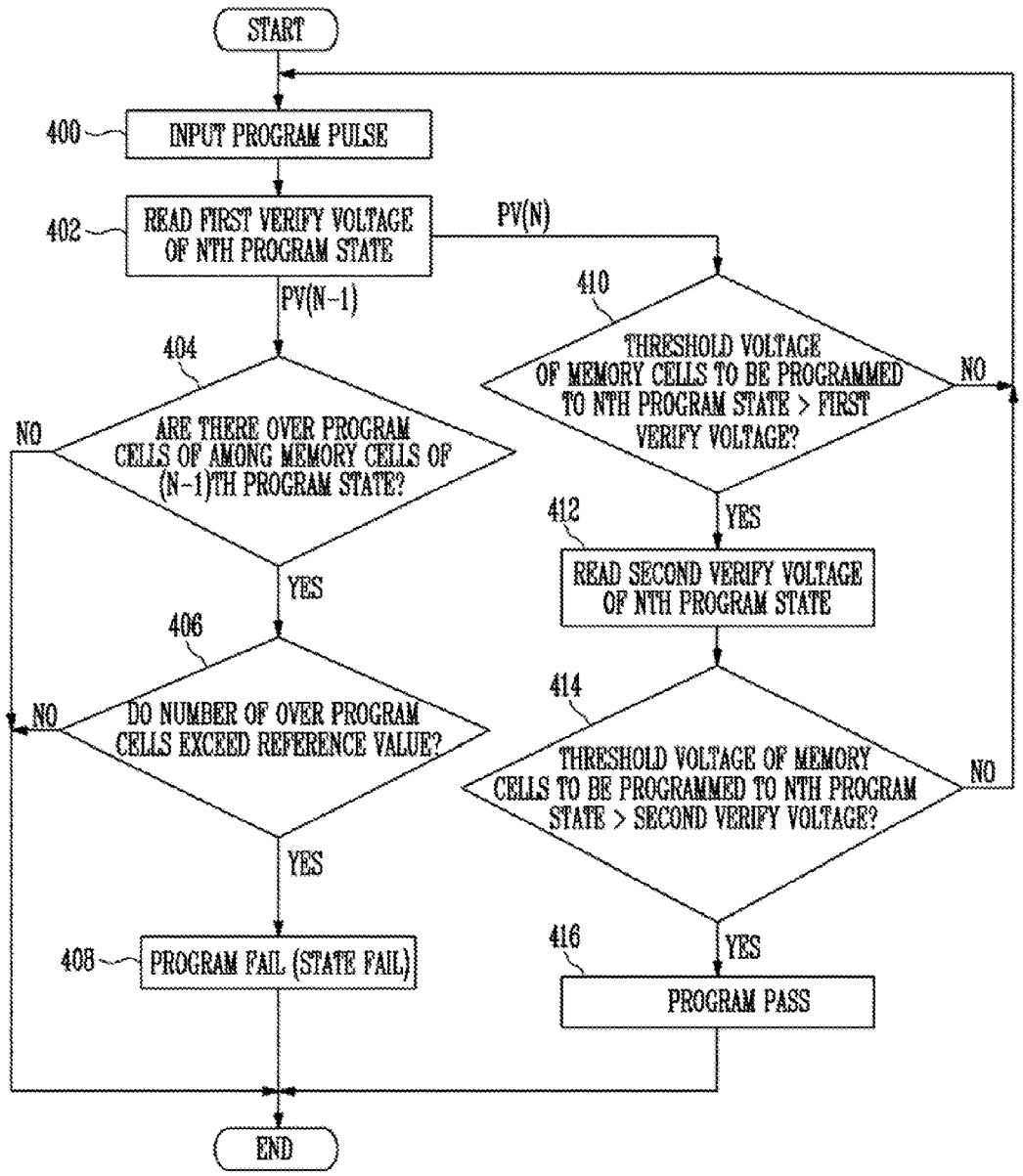
FIG. 4 is a flowchart illustrating a program verify method of a semiconductor memory device according to an embodiment of the present disclosure.
Figure 5:
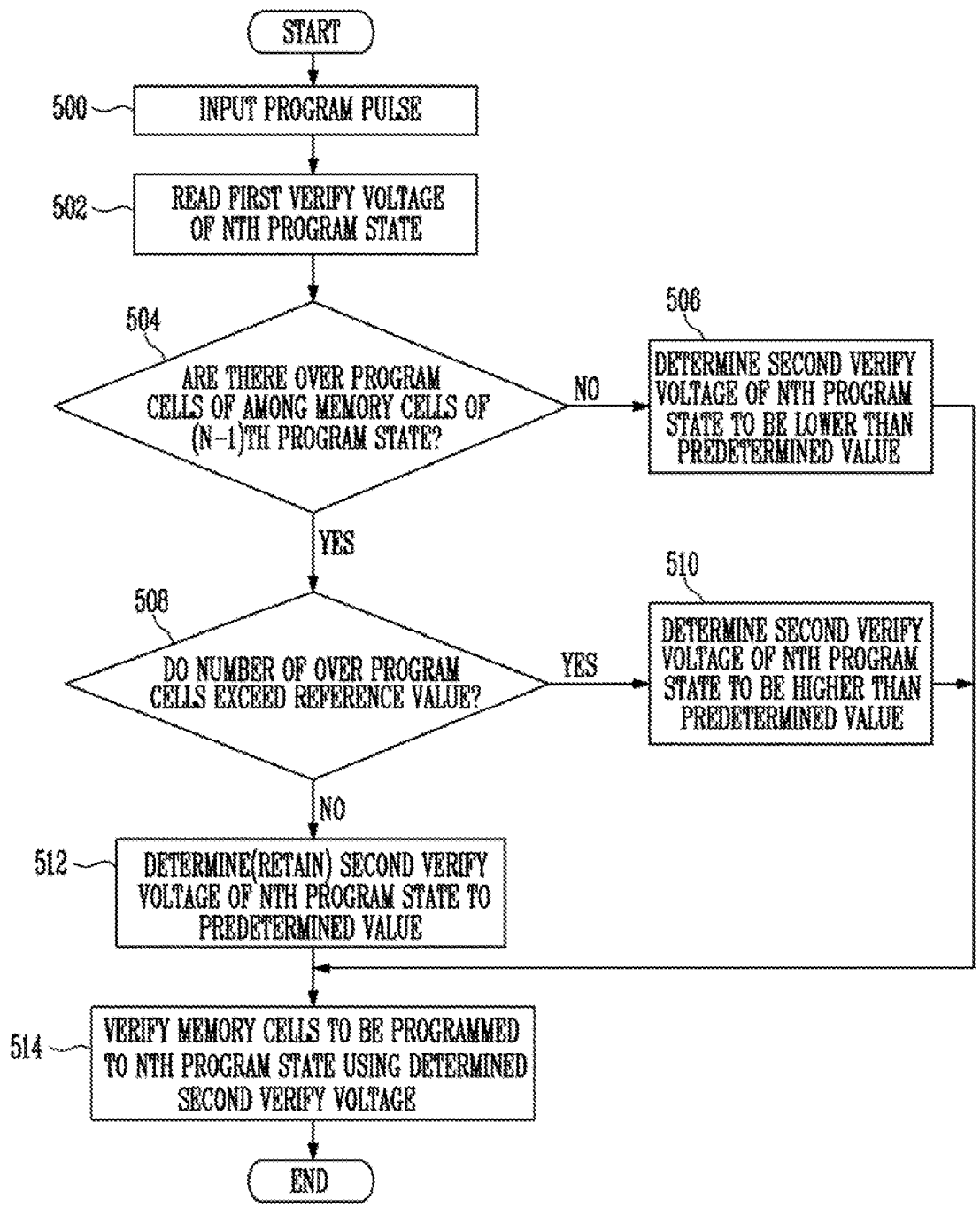
FIG. 5 is a flowchart illustrating a program verify method of a semiconductor memory device according to another embodiment of the present disclosure.

Explanation on the verification method may be made in further detail with reference to FIGS. 4 and 5.

FIG. 4 is a flowchart illustrating the program verification method of the semiconductor memory device according to an embodiment of the present disclosure.

According to FIG. 4, the semiconductor memory device inputs a program pulse into word lines of selected memory cells at step 400.

At step 402, the semiconductor memory device applies a first verify voltage of a $N^{th}$ program state PVN to a selected word line. The first to $m^{th}$ page buffers PB1 to PBm read page data from the selected memory cells through the first to $m^{th}$ bit lines BL1 to BLm. The selected memory cells may fall in one of memory cells programmed to the $N-1^{th}$ program state and memory cells to be programmed to the $N^{th}$ program state. The verify operation may be performed to the memory cells programmed to the $N-1^{th}$ program state and the memory cells to be programmed to the $N^{th}$ program state at the same time. That is, an over program verify operation may be performed using the first verify voltage for the memory cells programmed to the $N-1^{th}$ program state, and the first verify operation may be performed using the first verify voltage for the memory cells to be programmed to the $N^{th}$ program state. The over program verify operation regarding the $N-1^{th}$ program state and the first verify operation regarding the $N^{th}$ program state may be performed simultaneously or sequentially.

At step 404, the semiconductor memory device performs the over program verify operation regarding the memory cells of the $N-1^{th}$ program state PVN-1. That is, the semiconductor memory device may determine whether there exists over program cells from among the memory cells of the $N-1^{th}$ program state PVN-1. The first verify voltage of the $N^{th}$ program state may be used as the over program verify voltage of the $N-1^{th}$ program state. Specifically, during the over program verify operation, it may be determined whether the threshold voltages of the memory cells programmed to the $N-1^{th}$ program state exceed the first verify voltage of the $N^{th}$ program state.

At step 404, when the threshold voltages of the memory cells programmed to the $N-1^{th}$ program state do not exceed the first verify voltage of the $N^{th}$ program state, the program may be ended without outputting the program fall signal.

When the threshold voltages of the memory cells programmed to the $N-1^{th}$ program state exceed the first verify voltage of the $N^{th}$ program state, an error may occur during the read operation regarding the corresponding memory cells. Therefore, when there exist over program cells, it is determined whether the number of the over program cells exceeds a reference value at step 406.

Herein, the reference value may be the number of bits that may be corrected by an Error Correction Code (ECC) block provided in the external controller that controls the semiconductor memory device 50.

When the number of over program cells exceeds the reference value, it may not be possible to correctly read the data programmed in the corresponding page or a lot of errors may occur, and thus a program fail signal may be output step 408. Although not illustrated in the drawings, when the program fall signal of a memory cell is output to the external controller, the external controller may designate the selected page as an inappropriate page, and select a next page and re-transmit a program command.

At step 406, when the number of over program cells is within the reference value, it is possible to correct an error bit during the read operation, and thus the program may be ended without outputting the program fall signal.

Besides performing the over program verify operation regarding the memory cells of the $N-1^{th}$ program state through steps 404 to 408, the first verify operation may be performed regarding the memory cells to be programmed to the $N^{th}$ program state at step 410. Herein, the first verify operation may be the pre-verify operation. The semiconductor memory device may determine whether the threshold voltages of the memory cells to be programmed to the $N^{th}$ program state exceed the first verify voltage at step 410.

When the threshold voltages of the memory cells are below the first verify voltage as a result of the first verify operation of step 410, it may be returned to step 400 and re-input a program pulse. Herein, the Incremental Step Pulse Programming (ISSP) method may be used.

When the threshold voltages of the memory cells of the selected page exceed the first verify voltage as a result of the first verify operation of step 410, the data stored in the selected page is read with the second verify voltage of the $N^{th}$ program state at step 412.

At step 414, the semiconductor memory device may determine whether the threshold voltages of the memory cells to be programmed to the $N^{th}$ program state exceed the second verify voltage based on the read page data of step 412. Herein, the second verify operation using the second verify voltage may be the main verify operation. The threshold voltages of the memory cells to be programmed to the $N^{th}$ program state exceeding the second verify voltage mean that the memory cells are programmed to the $N^{th}$ program state, and thus the semiconductor memory device may output a program pass signal at step 416. When the threshold voltages of the selected memory cells are greater than the first verify voltage of step 410 and less than the second verify voltage of step 414, it may be returned to step 400 to apply the program pulse to the selected word line through the ISSP method.

Herein, although not illustrated in the drawings, when a voltage that is greater than 0V and less than source voltage Vcc is applied to the bit lines connected to the corresponding memory cells, the increase extent of the threshold voltages of the corresponding memory cells may be reduced, thereby preventing the threshold voltages from becoming greater than the target verify voltage. Accordingly, it is possible to program the selected memory cells such that the threshold voltages of the selected memory cells are distributed within a narrow range.

FIG. 5 is a flowchart that illustrates a program verify method of a semiconductor memory device according to another embodiment of the present disclosure.

According to the embodiment of FIG. 5, the second verify voltage of the $N^{th}$ program state is determined according to the over program verify result of the $N-1^{th}$ program state.

Specifically, the semiconductor memory device inputs a program pulse to word lines of selected memory cells at step 500.

At step 502, the semiconductor memory device applies a first verify voltage of a $N^{th}$ program state PVN to a selected word line. The first to $m^{th}$ page buffers PB1 to PBm read page data from the selected memory cells through the first to $m^{th}$ bit lines BL1 to BLm.

At step 504, the semiconductor memory device performs the over program verify operation regarding memory cells of a $N-1^{th}$ program state PVN-1. That is, the semiconductor memory device may determine whether there exists over program cells from among the memory cells of the $N-1^{th}$ program state PVN-1. The first verify voltage of the $N^{th}$ program state may be used as the over program verify voltage of the $N-1^{th}$ program state. Specifically, during the over program verify operation, it may be determined whether the threshold voltages of the memory cells programmed to the $N-1^{th}$ program state exceed the first verify voltage of the $N^{th}$ program state.

At step 504, when the threshold voltages of the memory cells programmed to the $N-1^{th}$ program state do not exceed the first verify voltage of the $N^{th}$ program state, the semiconductor memory device may set the second verify voltage of the $N^{th}$ program state to be less than a predetermined value at step 506. Herein, the difference between the second verify voltage and the predetermined value may vary according to the semiconductor memory device. This is to retain the gap between the program states so as to secure the read and reliability margin. Nonexistence of over program cells means that the threshold voltage distribution of the memory cells programmed to the $N-1^{th}$ program state is formed within a narrow range. Therefore, a low voltage of the $N^{th}$ program state is shifted to a small value so as to maintain a certain gap between the program states.

At step 504, when the threshold voltages of the memory cells programmed to the $N-1^{th}$ program state exceed the first verify voltage of the $N^{th}$ program state, the semiconductor memory device may determine whether the number of the over program cells exceeds the reference value at step 508. Herein, the reference value may be the number of bits that may be corrected by an Error Correction Code (ECC) block provided in the external controller that controls the semiconductor memory device 50.

When the number of over program cells exceeds the reference value, it may not be possible to correctly read the data programmed to the corresponding page, or a lot of errors may occur, and thus the second verify voltage of the $N^{th}$ program state may be set to be greater than the predetermined value at step 510. Differently from the embodiment described with reference to FIG. 4, the second verify is set to be greater than the predetermined value in order to shift the distribution of the $N^{th}$ program state to the higher voltage level. Therefore, the selected page may be usable even if the number of the over program cells exceeds the number of bits that can be corrected.

At step 508, when the number of over program cells is within the reference value, the second verify voltage of the $N^{th}$ program state may be set to the predetermined value at step 512. This is because even if the over program cells generate an error bit, the error bits may be corrected during the read operation.

At step 514, the semiconductor memory controller may perform the second verify operation regarding the memory cells to be programmed to the $N^{th}$ program state using the second verify voltage determined at one of steps 506, 510 and 512. Step 514 may be performed the same way as steps 412, 414, and 416 of FIG. 4. When the second verify voltage of the $N^{th}$ program state is changed according to the embodiment of FIG. 5, the read voltage regarding the corresponding program state may be changed accordingly.

In the drawings, the first verify regarding the memory cells to be programmed to the $N^{th}$ program state is not illustrated, but it may be performed in the same manner as step 410 of FIG. 4, and it may be performed at the same time as or prior to steps 504 to 512 of FIG. 5.

Figure 6:
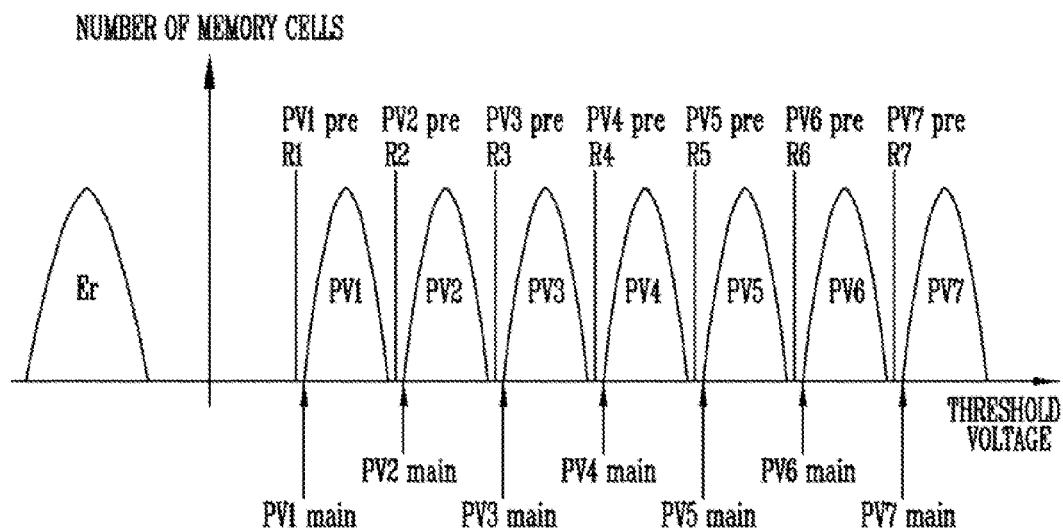
FIG. 6 is a view of a program verify voltage of a semiconductor memory device according to another embodiment of the present disclosure.

FIG. 6 is a view for explaining a program verify voltage of the semiconductor memory device according to another embodiment of the present disclosure.

FIG. 6 shows the first verify voltages of the program states having the same voltage level as the read voltage during the program verify operation.

The program states of the memory cells may be verified using the first verify voltage and second verify voltage. In various embodiments, the first verify voltage may be a pre-verify voltage, and the second verify voltage may be a main verify voltage.

The first verify voltage at a single program state may be used in a first verify operation for the program state, and a second verify voltage may be used in a second verify operation for the program state.

The first verify voltage of the program state may be used in verifying the over program for the lower program state of the program state. That is, the first verify voltage may be used in the first verify operation for the program state and over program verify operation for the lower program state of the program state, and the second verify voltage may be used in the second verify operation for the program state.

The first verify voltage PV1 pre of the first program state PV1 may be set to be the same as the first read voltage R1. The first verify voltage PV2 pre of the second program state PV2 may be set to the same voltage level as the second read voltage R2. The first verify voltage PV3 pre of the third program state PV3 may be set to the same voltage level as the third read voltage R3. The first verify voltage PV4 pre of the fourth program state PV4 may be set to the same voltage level as the fourth read voltage R4. The first verify voltage PV5 pre of the fifth program state PV3 may be set to the same voltage level as the fifth read voltage R5. The first verify voltage PV6 pre of the sixth program state PV6 may be set to the same voltage level as the sixth read voltage R6. The first verify voltage PV7 pre of the seventh program state PV7 may be set to the same voltage level as the seventh read voltage R7.

Figure 7:
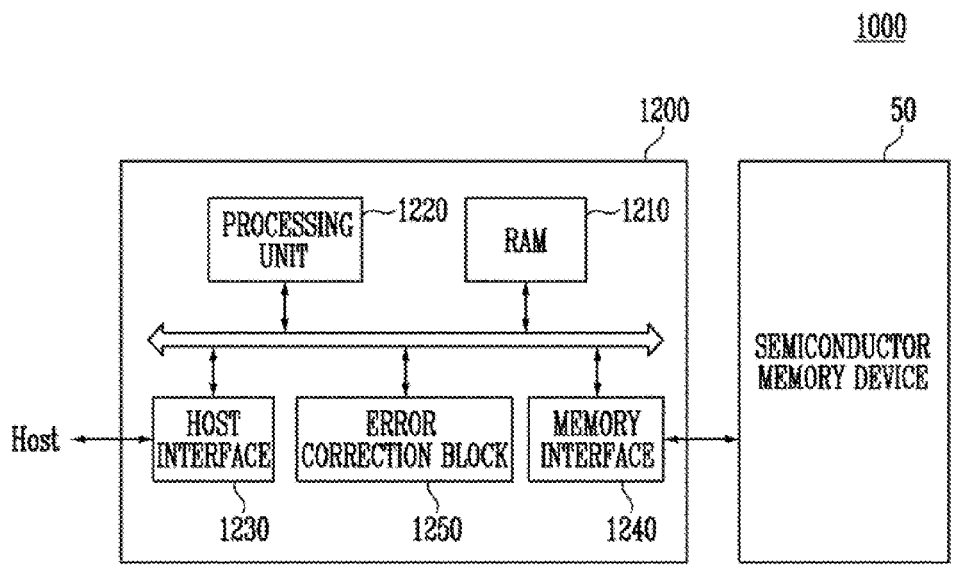
FIG. 7 is a block diagram illustrating a memory system that includes the semiconductor memory device of FIG. 2.

FIG. 7 is a block diagram illustrating a memory system 1000 that includes the semiconductor memory device 50 of FIG. 1.

Referring to FIG. 7, the memory system 1000 includes the semiconductor memory device 50 and controller 1200.

The semiconductor memory device 50 may be configured and operate as explained with reference to FIG. 1. Hereinafter, repeated explanation may be omitted.

The controller 1200 is connected to the host and semiconductor memory device 50. The controller 1200 is configured to access the semiconductor memory device 50 in response to a request from the host. For example, the controller 1200 is configured to control a reading, writing, erasing, and background operations of the semiconductor memory device 50. The controller 1200 is configured to provide an interface between the semiconductor memory device 50 and host. The controller 1200 is configured to drive a firmware for controlling the semiconductor memory device 50.

The controller 1200 includes a RAM (Random Access Memory) 1210, processing unit 1220, host interface 1230, memory interface 1240, and error correction block 1250.

The RAM 1210 is used as one of an operating memory of the processing unit 1220, cache memory between the semiconductor memory device 50 and host, and buffer memory between the semiconductor memory device 50 and host.

The processing unit 1220 controls overall operations of the controller 1200.

The processing unit 1220 is configured to randomize the data received from the host. For example, the processing unit 1220 may randomize the data received from the host using a randomizing seed. The randomized data is data to be stored (see FIG. 1), that may be provided to the semiconductor memory device 50 and programmed in the memory cell array (see FIG. 1) 100.

The processing unit 1220 is configured to de-randomize the data received from the semiconductor memory device 50 during a reading operation. For example, the processing unit 1220 may de-randomize the data received from the semiconductor memory device 50 using the de-randomizing seed. The de-randomized data may be output to the host.

In an embodiment, the processing unit 1220 may perform a randomize or de-randomize operation by driving a software or firmware.

The host interface 1230 includes a protocol for performing data exchange between the host and controller 1200. In an embodiment, the controller 1200 is configured to communicate with the host through at least one of a USB (Universal Serial Bus) protocol, MMC (MultiMedia Card) protocol, PCI (Peripheral Component Interconnection) protocol, PCT-E (PCI-express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol and private protocol and the like.

The memory interface 1240 interfaces with the semiconductor memory device 50. For example, the memory interface includes a NAND interface or NOR interface.

The error correction block 1250 is configured to detect an error of the data received from the semiconductor memory device using the ECC (Error Correcting Code), and to correct the error.

The controller 1200 and semiconductor memory device 50 may be integrated into one semiconductor device. In an embodiment, the controller 1200 and semiconductor memory device 50 may be integrated into one semiconductor device and form a memory card. For example, the controller 1200 and semiconductor memory device 50 may be integrated into one semiconductor device, and form a memory card such as a PC card (PCMCIA, personal computer memory card international association) a compact flash card (CF), smart media card (SM, SMC), memory stick, multimedia card (MMC, RS-MMC, MMCmicro), SD card (SD, miniSD, microSD, SDHC), and universal flash memory device (UFS) and the like.

The controller 1200 and semiconductor memory device 50 may be integrated into one semiconductor device and form an SSD (Solid State Drive). The semiconductor drive (SSD) includes a storage device configured to store data in the semiconductor memory. When the memory system 1000 is used as a semiconductor drive (SSD), the operating speed of the host connected to the memory system 1000 is significantly improved.

In another example, the memory system 1000 is provided as one of various components such as a computer, UMPC (Ultra Mobile PC), workstation, net-book, PDA (Personal Digital Assistants), portable computer, web tablet, wireless phone, mobile phone, smart phone, e-book, PMP (Portable Multimedia Player), portable game device, navigation device, black box, digital camera, 3-dimensional television, digital audio recorder, digital audio player, digital picture recorder, digital picture player, digital video recorder, digital video player, an apparatus for transceiving information in a wireless environment, one of various electronic devices that form a home network, one of various electronic devices that form a computer network, one of various electronic devices that form a telematics network, RFID apparatus, and various components that form a computing system.

In an embodiment, the semiconductor memory device 50 or memory system 1000 may be packed in various formats. For example, the semiconductor device 50 or memory system 1000 may be packaged in a method of PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline integrated circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

Figure 8:
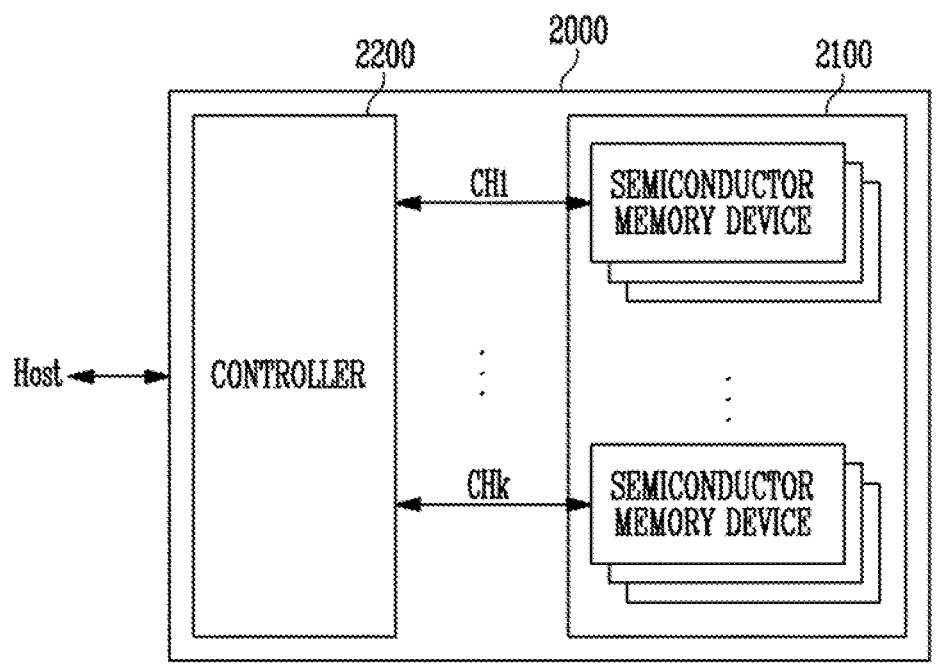
FIG. 8 is a block diagram illustrating an application of the memory system of FIG. 7.

FIG. 8 is a block diagram illustrating an application example 2000 of the memory system 1000 of FIG. 7.

Referring to FIG. 8, the memory system 2000 includes a semiconductor memory device 2100 and controller 2200. The semiconductor memory device 2100 includes a plurality of semiconductor memory chips. The plurality of semiconductor memory chips are divided into a plurality of groups.

In FIG. 8, it is illustrated that the plurality of groups each communicates with the controller 2200 through a first to $k^{th}$ channel (CH1~CHk). Each semiconductor memory chip may be configured in the same manner as one of the semiconductor memory device 500 explained with reference to FIG. 1, and may operate accordingly.

Each group is configured to communicate with the controller 2200 through one common channel. The controller 2200 is configured in the same manner as the controller 1200 explained with reference to FIG. 7, and is configured to control the plurality of memory chips of the semiconductor memory device 2100 through the plurality of channels (CH1~CHk).

In FIG. 8, it was explained that the plurality of semiconductor memory chips are connected to one channel. However, the memory system 2000 may be changed such that one semiconductor memory chip is connected to one channel.

Figure 9:
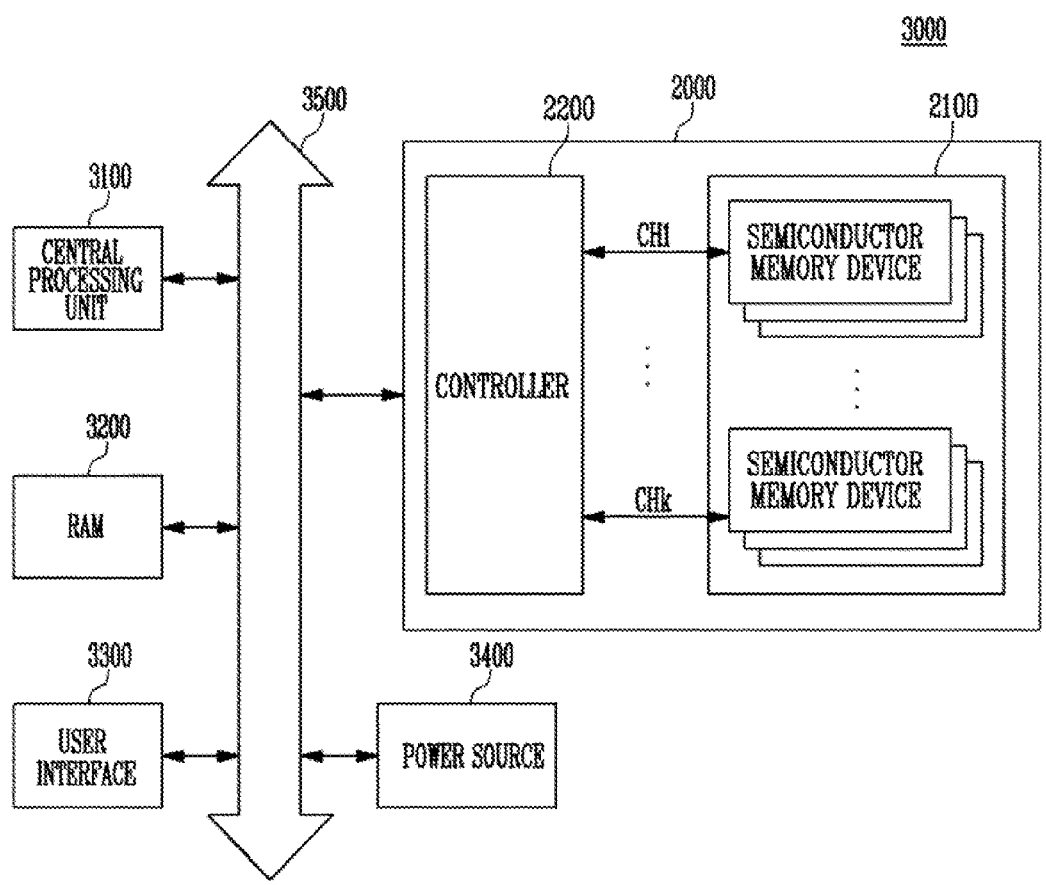
FIG. 9 is a block diagram illustrating a computing system that includes the memory system of to FIG. 8.

FIG. 9 is a block diagram illustrating a computing system 3000 that includes the memory system 2000 explained with reference to FIG. 8.

Referring to FIG. 9, the computing system 3000 includes a central processing unit 3100, RAM (Random Access Memory) 3200, user interface 3300, power source 3400, system bus 3500, and memory system 2000.

The memory system 2000 is electrically connected to the central processing unit 3100, RAM 3200, user interface 3300, and power source 3400 through a system bus 3500. The data provided through the user interface 3300 or processed by the central processing unit 3100 is stored in the memory system 2000.

In FIG. 9, it is illustrated that the semiconductor memory device 2100 is connected to the system bus 3500 through the controller 2200. However, the semiconductor memory device 2100 may be configured to be directly connected to the system bus 3500. Herein, the functions of the controller 2200 may be performed by the central processing unit 3100 and RAM 3200.

FIG. 9 illustrates the memory system 2000 explained with reference to FIG. 8. However, the memory system 2000 may be substituted with the memory system 1000 explained with reference to FIG. 8. In an embodiment, the computing system 3000 may be configured to include all the memory systems 1000, 2000 explained with reference to FIGS. 7 and 8.

According to an embodiment of the present disclosure, a method of determining whether or not selected memory cells are over program cells is performed. Therefore, a semiconductor memory device with improved reliability is provided.

In the drawings and specification, there have been disclosed typical embodiments of the invention, and although specific terms are employed, they are used in a generic and descriptive sense only and not for purposes of limitation.

As for the scope of the invention, it is not to be limited to the embodiments disclosed, but to be set forth in the following claims and equivalents thereof.

Furthermore, in the embodiments of the invention, any step may be performed optionally or may be omitted. Furthermore, any step in the embodiments need not be performed in the order disclosed herein. It will be understood by those of ordinary skill in the art that various changes in form and details may be made therein without departing from the spirit and scope of the present invention as defined by the following claims.

What is claimed is:

1. An operating method of a semiconductor memory device including a plurality of memory cells programmed to have one of a plurality of program states differentiated according to threshold voltages of the memory cells, each program state being verified by a double verify operation using a pre-verify voltage and a main verify voltage, the method comprising:
   determining whether over program cells exist among the memory cells programmed to a N−1th program state, by using the pre-verify voltage of a Nth program state from among the plurality of program states;
   determining, when the over program cells exist, whether the number of the over program cells exceeds a reference value; and
   outputting, when the number of the over program cells exceeds the reference value, a program fail signal to a controller.

2. The method according to claim 1, further comprising:
   performing a first verify operation to the memory cells to be programmed to the Nth program state using the pre-verify voltage; and
   when the first verify operation passes, performing a second verify operation to the memory cells to be programmed to the Nth program state using the main verify voltage of the Nth program state.

3. The method according to claim 1, wherein the determining whether over program cells exist includes determining over program cells exist when threshold voltages of the memory cells programmed to the N−1th program state exceed the pre-verify voltage.

4. The method according to claim 1, wherein the reference value is the number of error bits that can be corrected by the controller.

5. An operating method of a semiconductor memory device including a plurality of memory cells programmed to have one of a plurality of program states differentiated according to threshold voltages of the memory cells, the method comprising:
   determining whether over program cells exist among memory cells programmed to a N−1th program state, by using a first verify voltage of a Nth program state from among the plurality of program states;
   determining a second verify voltage of the Nth program state according to a result of the determining whether the over program cells exist; and
   performing a verify operation to the memory cells to be programmed to the Nth program state using the determined second verify voltage.

6. The method according to claim 5, wherein the determining of the second verify voltage includes setting the second verify voltage to be less than a predetermined value when the over program cells exist.

7. The method according to claim 5, wherein the determining of the second verify voltage includes setting the second verify voltage to be higher than a predetermined value when the over program cells exist and the number of the over program cells exceeds a reference value.

8. The method according to claim 5, wherein the determining of the second verify voltage includes setting the second verify voltage to the predetermined value when the over program cells exist and the number of the over program cells is below a reference value.

9. The method according to claim 5, wherein the first verify voltage is a high voltage level of the N−1th program state.

10. The method according to claim 5, wherein the first verify voltage is a read voltage for reading the N−1th program state.

11. The method according to claim 7, wherein the reference value is the number of error bits correctable by the controller.

12. A semiconductor memory device comprising:
a plurality of memory cells programmed to have one of a plurality of program states differentiated according to threshold voltages of the memory cells, wherein each program state among the plurality of program states is verified by a double verify operation which uses a pre-verify voltage and a main verify voltage; and
a peripheral circuit configured to:
determine whether over program cells exist among memory cells programmed to a N−1th program state using the pre-verify voltage of a Nth program state from among the plurality of program states,
determine whether the number of the over program cells exceeds a reference value when over program cells exist, and
output a program fail to a controller when the number of the over program cells exceeds the reference value.

13. The device according to claim 12,
wherein the peripheral circuit further performs a first verify operation to the memory cells to be programmed to the Nth program state using the pre-verify voltage, wherein when the first verify operation passes, the peripheral circuit further performs a second verify operation to the memory cells to be programmed to the Nth program state using the main verify voltage of the Nth program state.

14. The device according to claim 12, wherein the over program cell is a memory cell programmed to the N−1th program state and having a threshold voltage higher than the pre-verify voltage.

15. The device according to claim 12, wherein the reference value is the number of error bits that may be corrected by the controller.

16. A semiconductor memory device comprising:
a plurality of memory cells programmed to have one of a plurality of program states differentiated according to threshold voltages of the memory cells; and
a peripheral circuit configured to:
determine whether over program cells exist among memory cells programmed to a N−1th program state using a verify voltage of a Nth program state from among the plurality of program states,
determine a second verify voltage of the Nth program state according to a result of the determining whether the over program cells exist, and
perform a verify operation to the memory cells to be programmed to the Nth program state using the determined second verify voltage.

* * * * *